(12) United States Patent
Prasad et al.

(10) Patent No.: US 6,515,540 B1
(45) Date of Patent: Feb. 4, 2003

(54) HIGH ORDER MULTI-PATH OPERATIONAL AMPLIFIER WITH OUTPUT SATURATION RECOVERY

(75) Inventors: Ammisetti V. Prasad, Austin, TX (US); Murari Kejariwal, Austin, TX (US); Axel Thomsen, Austin, TX (US)

(73) Assignee: Cirrus Logic, Inc.

( * ) Notice: Subject to any disclaimer, the term of this patent is extended or adjusted under 35 U.S.C. 154(b) by 0 days.

(21) Appl. No.: 10/013,559

(22) Filed: Dec. 10, 2001

(51) Int. Cl.[7] .............................................. H03F 1/02
(52) U.S. Cl. ........................ 330/9; 330/253; 330/109; 330/107; 330/267; 330/261; 330/254; 330/297; 327/124; 341/118; 341/120; 341/143
(58) Field of Search ........................ 330/9, 253, 109, 330/107, 267, 261, 254, 757, 297; 327/124; 341/118, 120, 143

(56) References Cited

U.S. PATENT DOCUMENTS

| | | |
|---|---|---|
| 3,989,961 A | 11/1976 | Masreliez |
| 3,991,730 A | 11/1976 | Crall |
| 4,318,613 A | 3/1982 | Waiwood |
| 4,384,257 A | 5/1983 | Nola |
| 4,429,281 A | 1/1984 | Ito et al. |
| 4,502,020 A | 2/1985 | Nelson et al. |
| 4,509,037 A | 4/1985 | Harris |
| 4,559,502 A | 12/1985 | Huijsing |
| 4,559,634 A | 12/1985 | Hochschild |
| 4,628,279 A | 12/1986 | Nelson |
| 4,713,628 A | 12/1987 | Nelson |
| 4,757,270 A | 7/1988 | Rokos |
| 4,757,275 A | 7/1988 | Saller et al. |
| 4,766,367 A | 8/1988 | Saller et al. |
| 4,780,689 A | 10/1988 | Saller et al. |
| 4,808,942 A | 2/1989 | Milkovic |
| 4,906,944 A | 3/1990 | Frerking |
| 4,924,189 A | 5/1990 | Senn et al. |
| 4,926,178 A | 5/1990 | Mallinson |
| 4,939,516 A | 7/1990 | Early |
| 4,994,805 A | 2/1991 | Dedic et al. |
| 5,012,244 A | 4/1991 | Wellard et al. |
| 5,298,813 A | 3/1994 | Tanigawa et al. |
| 5,317,277 A | 5/1994 | Cavigelli |
| 5,446,405 A | 8/1995 | Ikeda |
| 5,451,901 A | 9/1995 | Welland |
| 5,477,481 A | 12/1995 | Kerth |
| 5,499,027 A * | 3/1996 | Karanicolas et al. ........ 341/120 |
| 5,635,871 A | 6/1997 | Cavigelli |
| 5,757,301 A * | 5/1998 | Kuo et al. ................. 341/143 |
| 5,798,664 A | 8/1998 | Nagahori et al. |
| 6,002,299 A * | 12/1999 | Thomsen .................... 330/107 |
| 6,037,891 A * | 3/2000 | Griph ........................ 327/491 |
| 6,111,606 A * | 8/2000 | Ikeda ........................ 327/552 |

OTHER PUBLICATIONS

Pernici et al., A CMOS Low–Distortion Fully Differential Power Amplifier with Double Nested Miller Compensator, IEEE Journal of Solid–State Circuits, vol. 28, No. 7, pp. 758–763 (Jul. 1993).

(List continued on next page.)

*Primary Examiner*—Michael Tokar
*Assistant Examiner*—Linh Van Nguyen
(74) *Attorney, Agent, or Firm*—James J. Murphy, Esq.; Winstead Sechrest & Minick, P.C.

(57) ABSTRACT

An amplifier is disclosed including multiple integrator stages. The amplifier includes a low-frequency path from a signal input to a signal output and relatively higher-frequency bypass paths around the first integrator stage. The paths converge at a summing node. To prevent instability when the integrators are saturated by large signals, the circuit includes a saturation detector which disables the relatively low-frequency paths during such saturation conditions.

27 Claims, 7 Drawing Sheets

OTHER PUBLICATIONS

Eschauzier, et al., Frequency Compensation Techniques for Low–Power Operational Amplifiers, Kluwer Academic Publishers, pp. 166–173 (1995).

Eschauzier, et al., A 100 MhZ 100–dB Operational Amplifier with Multipath Nested Miller Compensation Structure, IEEE Journal of Solid–State Circuits, vol. 27, No. 12, pp. 1709–1716 (Dec. 1992).

Yu et al., A high–Swing 2–V CMOS Operational Amplifier with Replica–Amp Gain Enhancement, IEEE Journal of Solid–State Circuits, vol. 28, No. 12, pp. 1265–1271 (Dec. 1993).

OP'T CYNDE et al., A CMOS Large–Swing Low Distortion Three–Stage Class AB Power Amplifier, IEEE Journal of Solid–State Circuits, vol. 25, No. 1, pp. 265–273 (Feb. 1990).

Lee, Wai Laing, A Novel Higher Order Interpolative Modulator Topology for Higher Resolution Oversampling and Converters, Master's Thesis, Massachusetts Institute of Technology, pp. 1–135 (Jun. 1987).

Lee et al., A Topology for Higher Order Interpolative Coders, IEEE, pp. 459–462 (1987).

Gardner, Floyd M., Phaselock Techniques, 2nd Edition, Wiley–Interscience, pp. 16–25, (1979).

Schwarz et al., Linear Systems, McGraw–Hill Book Co., pp. 422–429 (1965).

Grebene, Alan B., Analog Integrated Circuit Design, Van Nostrand Reinhold Company, pp. 155–170 (1972).

Hsieh et al., A low–Noise Chopper–Stabilized Differential Switched–Capacitor Filtering Technique, IEEE Journal of Solid–State Circuits, vol. SC–16, No. 6, pp. 708–715 (Dec. 1981).

Mehr et al., Discrete–Time Feedback Structures for High Precision Analog Signal Processing, IEEE Transactions on Circuits and Systems–II: Analog and Digital Signal Processing, vol. 43, No. 1, pp. 60–62 (Jan. 1996).

Enz et al., Circuit Techniques for Reducing the Effects of Op–Amp Imperfections: Autozeroing Correlated Double–Sampling and Chopper Stabilization, Proceedings of the IEEE, vol. 84, No. 11, pp. 1584–1614 (Nov. 1996).

Norsworth et al., Delta–Sigma Data Converters Theory, Design and Stimulation, IEEE Press, pp. 183–185 (1997).

Franco, Sergio, Design with Operational Amplifiers and Analog Integrated Circuits, McGraw–Hill Book Company, pp. 264–291 (1988).

You et al., A Multistage Amplifier Topology with Nested Gm–C Compensation for Low–Voltage Application, ISSCC, pp. 2–3 (Feb. 8, 1997).

National Semiconductor, Topics on Using the LM6181–A New Current Feedback Amplifier, National Semiconductor, Application Note 813, pp. 1–10 (Mar. 1992).

* cited by examiner

HIGH ORDER MULTI-PATH OPERATIONAL AMPLIFIER WITH OUTPUT SATURATION RECOVERY

INCORPORATION BY REFERENCE

The following commonly assigned patents and patent applications are hereby incorporated by reference in herein:

U.S. Pat. No. 6,002,299, issued Dec. 14, 1999 to Thomsen, et al.; and

U.S. patent application Ser. No. 09/678,160 to Ammisetti Prasad, et al., filed on Oct. 2, 2000.

FIELD OF THE INVENTION

The invention relates to conditionally stable operational amplifiers.

SUMMARY

An operational amplifier is a relatively high gain amplifier capable of being used in various kinds of feedback circuits. An operational amplifier circuits can, for example, provide programmable gain, signal summation, integration, and differentiation, and various other useful functions.

The most popular variety of operational amplifier has high-impedance differential signal inputs and a low impedance signal output, and functions as a high-gain differential voltage amplifier. Another kind of operational amplifier, known as an "operational transconductance amplifier," has high-impedance differential signal inputs and a high-impedance signal output, and functions as a differential voltage to current converter.

High accuracy operational amplifier circuits require large gain from zero frequency up to a certain closed-loop bandwidth. Most general-purpose operational amplifiers are constructed with a dominant pole in the open-loop frequency response in order to guarantee stability when any purely resistive voltage divider network provides a feedback signal. When the operational amplifier has such an open-loop frequency response, an enormous gain-bandwidth product is required for high accuracy. Designers of low-power or high-accuracy operational amplifier circuits have therefore considered conditional stability as a way of avoiding the gain-bandwidth product limitation of unconditionally stable operational amplifiers. A conditionally-stable operational amplifier has at least 180 degrees of phase lag for a frequency less than the frequency at which the operational amplifier has an open-loop unity gain, but the phase lag decreases to less than 180 degrees as the frequency increases to the open-loop unity gain frequency.

In accordance with a described embodiment, stability of a conditionally stable operational amplifier is ensured against large signals and transients (and associated saturation of the amplifier circuit) by use of a saturation detector and bypass circuits which collapses the system to an unconditionally stable system. The conditionally stable operational amplifier includes at least three integrator stages in a low frequency path from a signal input to a signal output, and a bypass path for bypassing at least one of the integrator stages in the maximum integration path. The bypass path(s) and the maximum integration path converge at a summing node combining signal from the low-frequency path with signal from the bypass path(s). According to this embodiment, stability of a conditionally stable multi-path operational amplifier is ensured against large signals and transients by disabling or bypassing low-bandwidth integrators when the output of the amplifier system is saturated.

DETAILED DESCRIPTION OF THE EMBODIMENTS

Figure 1:
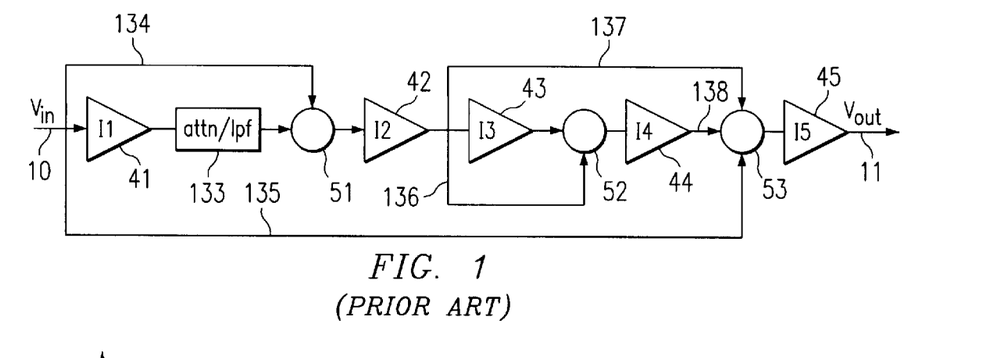
FIG. 1 is a schematic of a high order multi-path operational amplifier.

FIG. 1 is a schematic of a prior art high order multi-path operational amplifier from a signal input 10 to a signal output 11. This embodiment has five integrator stages 41,42, 43,44,45, and three summers 51,52,53. There is a low-frequency path including all five of the integrators 41–45, or more generally amplifiers 41–45, that is optimized for high gain, low noise, and low distortion. There are a number of higher-frequency paths 134,135,136,137 providing stability. Most of the power is consumed in the input stage 41 in order to reduce noise. Power consumption is reduced to some degree by using a relatively slow and relatively nonlinear output stage 45.

To obtain low noise in the input stage 41, the transistors in a differential amplifier of the input stage 41 can be physically large and have a very large transconductance. Although this large transconductance considerably reduces the effects of thermal noise, the 1/f noise is still significant. Moreover, the differential amplifier has a relatively large voltage offset. In order to reduce the 1/f noise and the voltage offset, the differential input stage may be chopper stabilized. Charge injection by the input chopper creates small input currents on the order of a few nanoamperes. Moreover, the chopping process creates an up-modulated offset waveform which is a square wave at the chopped frequency. A three-pole analog low-pass filter 133 having a bandwidth of 60 kHz, for example, can be used to attenuate these chopping artifacts. The low-pass filter 133 also has an attenuation factor of 1/64 at zero frequency, in order for the operational amplifier to have a desired degree of conditional stability. This rather high attenuation factor in turn sets a limit on the maximum amount of voltage offset that can be tolerated in the second stage integrator 42 without an objectionable shift in the quiescent voltage levels in the second stage integrator 42.

Each integrator or amplifier in the described embodiments has a frequency band within which it fully amplifies input signals without roll-off. As the frequency components of the input signal to the integrator approaches the corner frequency of the integrator, the amplification provided by the amplifier begins to "roll-off", or decrease. The steepness of the roll-off depends on the order of amplifier that is used. In the embodiment of FIG. 1, the first-stage integrator 41 would preferably have the lowest bandwidth and thus begin to roll-off at the lowest frequency, which as mentioned is determined by the corner frequency of the integrator.

In other words, in the embodiment of FIG. 1, the first integrator which rolls off is the first-stage integrator 41, which has the lowest bandwidth. There is also provided a feedforward bypass path 134 that bypasses the integrator 41. Within the bandwidth of the integrator 41, the amplification provided will be much larger than the input signal and so the effect of the input signal which bypasses the integrator 41 will be minimal. As the components of the input signal approach the "unity gain" frequency of the integrator 41, which is the frequency at which the integrator neither attenuates nor amplifies, the effect of the feedforward bypass signal through bypass path 134 becomes greater, until at high frequencies much above the corner frequency of the integrator 41, the feedforward bypass signal begins to dominate. This same effect is repeated for the third-stage integrator 43, which is bypassed by the feedforward bypass path 136, by the combination of the third- and fourth-stage integrators 43, 44, which are collectively bypassed by the feedforward bypass path 137, and by the combination of first-, second-, third-, and fourth-stage integrators, which are collectively bypassed by the feedforward bypass path 135. In the embodiment of FIG. 1, there is always one final-stage integrator 45 in the signal path. At very high frequencies, the feedforward bypass paths, and most particularly those paths that proceed straight from the input to the final-stage integrator 45, dominate. The single integrator forms a single pole response or a single order system, which will be stable over all frequencies.

At the lowest frequencies, the gain of the integrators dominates, and signal goes through all the blocks, it goes through all five integrator stages. As we increase the frequency, these integrators are bypassed, one by one, until as discussed above, at the highest frequency, the signal only passes through the fifth-stage integrator.

To be stable for high-amplitude signals, the high-frequency path at the summer should be stronger than all the rest of the low frequency paths combined. In FIG. 1, for example, at high frequency the path 135 should be stronger than the paths 137 and 138 combined together. Weights can be assigned to the different inputs to the summer to ensure stability. For example, the summer input which receives path 135 could be assigned a weight of 1, whereas the input receiving the 137 path could be assigned a weight of ½ and the input receiving the 138 path could be assigned a weight of ¼. The use of the weights addresses the large-signal stability issue for all the stages of the amplifier circuit, except for the final stage. The output-stage saturation, which can occur due to a large signal output, reduces the unity-gain bandwidth of the output stage, while the rest of the stages are unaffected. Therefore, a system is needed to detect and address the stability of the system when the output stage is saturated.

Figure 2A:
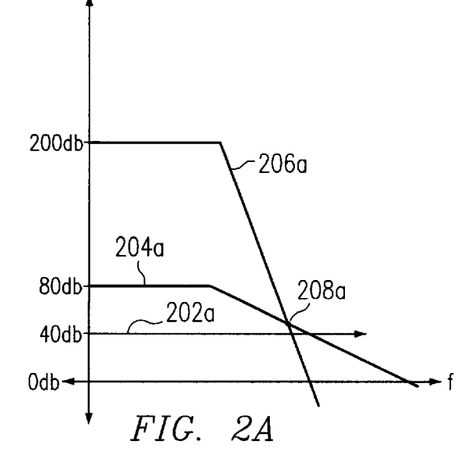
FIGS. 2A–2B are Bode gain plots of an exemplary amplifier system.
Figure 2B:
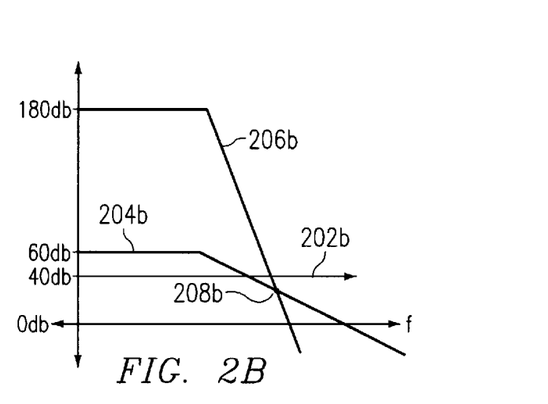

FIGS. 2A–2B are Bode gain plots of an exemplary amplifier system. These Bode gain plots graph a system's logarithmic voltage gain (log (Vout/Vin)) as it varies with frequency. The plots illustrate the need to maintain in this particular embodiment the closed-loop voltage gain 202*a,b* of the system beneath the hand-over point 208*a,b* at which the gain of the Low Frequency ("L.F.") path 206*a–b* begins to drop below the voltage gain (or simply, "gain") of the High Frequency ("H.F.") path 204*a–b*. Stated simply, in this particular architecture, the closed-loop system voltage gain must be less than the gain which would be provided by the system's open-loop gain at the hand-over frequency 208*a–b*.

FIG. 2B shows the effect on the open loop voltage gain of the system when the amplifier circuit is saturated by an output signal approaching near the positive or negative supply rails for the amplifier. When this happens, the output node goes very close to the rails (power supplies), so the H.F. path "saturates" and thereby the amplifier's voltage gain is decreased. In the exemplary graph, a 20 dB reduction in gain is illustrated. The actual loss in gain from this output saturation will depend on the particular circuit implementation. As can be seen in FIG. 2B, when the H.F. path 204*b* saturates and loses gain, this shifts the hand-over point to the point shown 208*b*, which is lower in voltage gain relative to the hand-over point 208A (FIG. 2A). Again, to be stable the system closed-loop gain must be kept beneath the hand-over point. Thus, the closed-loop gain indicated by line 202*b* must be reduced in FIG. 2B (relative to 202*a* in FIG. 2A) in order for the circuit to be stable. Specifically, the 202*b* line indicating the closed-loop gain must be kept beneath the hand-over point 208*b* to maintain stable circuit operation in the described embodiment.

Figure 3A:
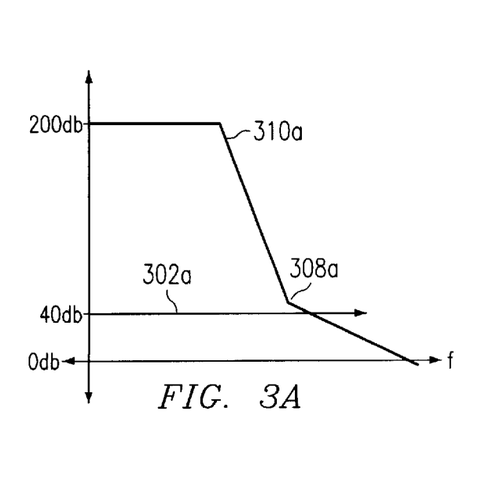
FIGS. 3A–3B illustrate the Bode plots of FIGS. 2A and 2B wherein the system response to the high- and low-frequency paths are combined.
Figure 3B:
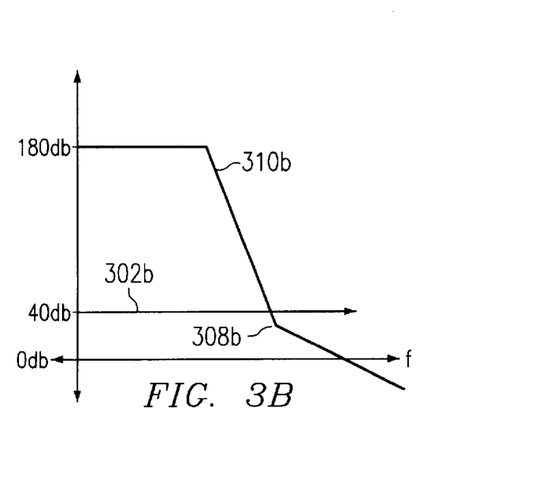

FIGS. 3A–3B illustrate the Bode plots of FIGS. 2A and 2B with the combination signal plot of 310*a* represents the added signals of 206*a* and 204*a*, and where point 308*a* represents the hand-over point 208*a* of FIG. 2A. As can be seen in FIG. 3A, the 40 db closed-loop gain is set below the hand-over point 308*a*. Thus, the circuit which generated the Bode plot of FIG. 3A is stable at a 40 db closed-loop gain. In FIG. 3B, the operation of the circuit is shown with the output of the amplifier in saturation or near saturation mode. Which means that the output is operating close to either the high or low power supplies for the circuit. This diminishes the high frequency signal performance such that the hand-over point is shifted to point 308b. Therefore, this hand-over point is now below the 40 db closed-loop gain illustrated by line 302b. Because the 308b hand-over point is now below that closed-loop gain at 40 db, the circuit would be unstable if operated in this mode.

Referring still to the plots of FIGS. 2–3, with further reference to the circuit of FIG. 1, the gain reduction of the circuit when in saturation is reflected in the two "B" signal plots (FIG. 2B and 3B). In this embodiment, a 20 db gain reduction is assumed in the fifth-stage integrator 45 (see FIG. 1), which is illustrated by the 20 db reduction in the L.F. path plot 206b relative to the plot 206a, as well as in the H.F. path plot 204b relative to the plot 204a, as well as in the combined plot 310b relative to plot 310a. The 20 db reduction is seen in all the signal plots, because all signal paths pass through the fifth-stage integrator 45.

Figure 4:
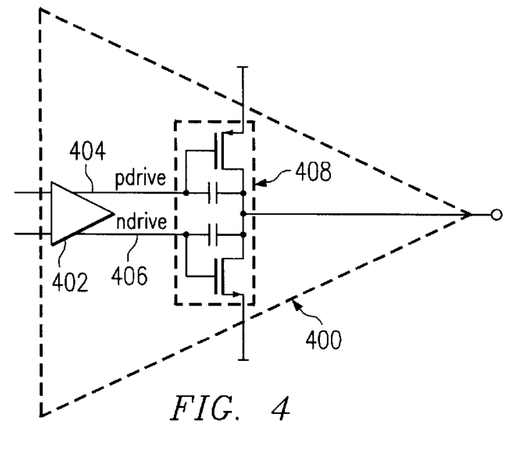
FIG. 4 is a more detailed block diagram of I5 integrator generation of npdrive from pdrive.

Shown in FIG. 4 is a more-detailed block diagram of the I5 integrator. Within this FIG. 4 is shown are the first stage and second stage of I5. The first stage is represented by 402. And 402 has outputs pdrive 404 and ndrive 408. The second stage is represented by the circuitry shown in the block 408. The circuitry of FIG. 4 is exemplary circuitry for the I5 integrator, which can be constructed as a traditional operational amplifier design such as a single stage amplifier, a Miller-compensated two-stage amplifier, a current feedback amplifier, or a more complex structure.

Figure 5:
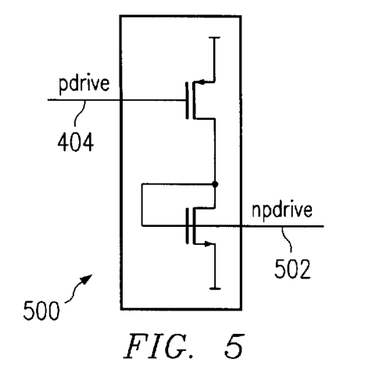
FIG. 5 is a schematic diagram of another embodiment of a high order amplifier.

In FIG. 5, a circuit 500 is provided to generate an npdrive signal 502 from the pdrive signal 404 of FIG. 4. The npdrive signal 502 is provided to the saturation detection circuitry of FIG. 6, below. The purpose of this signal conversion is essentially to provide a positive-sense signal representing the absolute value of the pdrive signal so that the saturation detect circuit of FIG. 6 can compare both the positive-going waveform and the negative-going waveform to the same value reference signal, "maxref," as shown below in FIG. 6.

Figure 6:
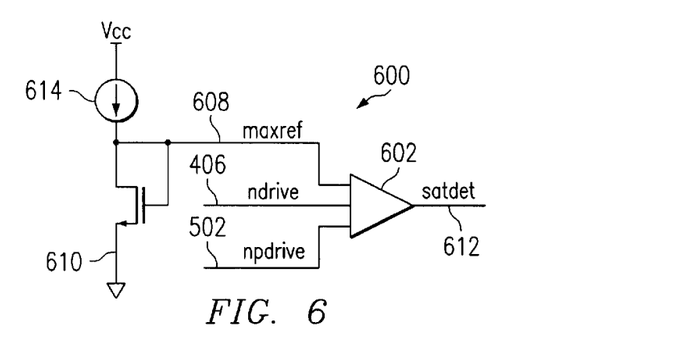
FIG. 6 is a schematic diagram of a circuit that can be used to detect a saturation condition in an amplifier.

FIG. 6 represents a saturation detection circuit 600, which will detect the situation where the I5 integrator is operating in saturation mode and thereby causing the instability problem initiated by the shifting of the hand-over point. In FIG. 6, it is assumed that the positive and negative supply rails are of the same magnitude, and therefore a single "maxref" reference signal 608 is provided to compare to the ndrive and npdrive signal inputs 406, 502. The reference signal 608 is derived from one of the supply rails, Vcc in this instance, by providing a defined current 614 through a transistor 610. The ndrive and npdrive signals 406, 502 are then compared to the reference signal 608 by the comparator 602. If the ndrive signal 406 or the npdrive signal 502 exceeds the reference signal 608, then saturation is detected and the comparator 602 asserts the "satdet" saturation detect signal 612. In the situation where the supply voltages are not balanced, it would be possible to implement circuit 600 using two different comparators, one for the ndrive signal compared to a signal referenced to Vdda, and one for the npdrive signal referenced to Vpp. In this alternative approach, the outputs of the two comparators could be OR'd together using an OR gate such that the saturation detect signal 612 would still be asserted if either input voltage exceeded an appropriate reference voltage relative to the supply voltage.

Figure 7:
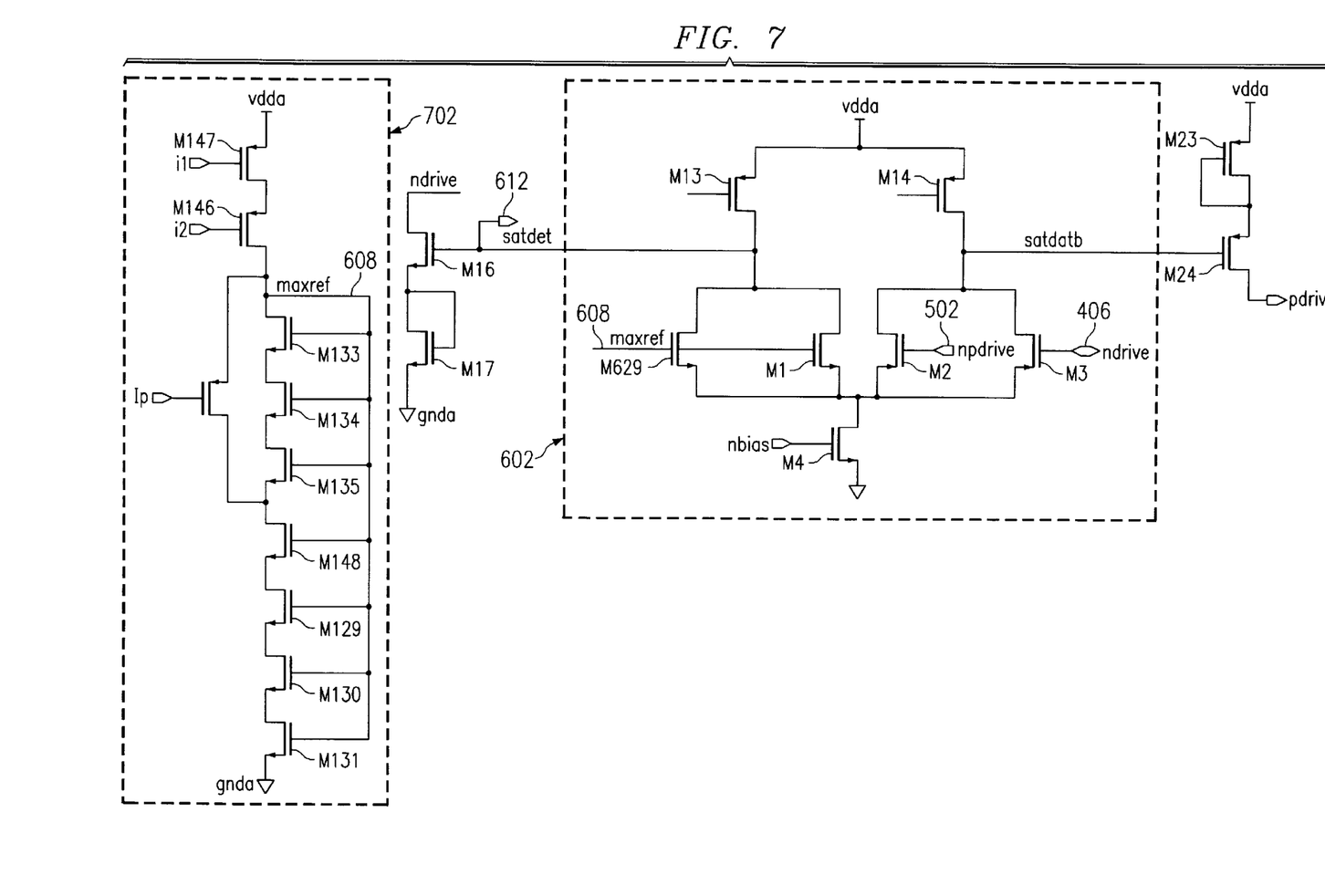
FIG. 7 is a more-detailed circuit diagram of an embodiment of the circuit shown in FIG. 6.

FIG. 7 is a more-detailed circuit diagram of an embodiment of the circuit shown in FIG. 6. As previously mentioned, the saturation of the output stage integrator causes a reduction in the gain of the high frequency and also the low frequency paths. Such saturation also shifts the hand-over point from 208a to 208b and 308a to 308b (see FIGS. 2–3). As in FIG. 6, the saturation detector circuit compares the voltages of the input signals, ndrive and npdrive 406, 502, to a predetermined reference voltage "maxref" 608. The voltage for "maxref" 608 is generated by a reference voltage generator 702. The comparator 602 is comprised of a differential amplifier, which is a circuit that tells which of two inputs is larger. One input of the comparator 602 is the "maxref" reference voltage signal 608, whereas the other inputs to the comparator 602 are ndrive and npdrive signals 406, 502. If either of these signals 406, 502 is greater than the "maxref" signal 608, the output 612 ("satdet") of the comparator is positively asserted. The ndrive signal 406 and npdrive signal 502 come from the I5 integrator. These are internal signals to the block diagram version of the I5 integrator, and these additional signals are shown in the more detailed block diagram of the I5 integrator which is shown in FIG. 4.

Thus, comparator 602 operates to detect through the ndrive signal 406 and the npdrive signal 502 whether the output of the I5 integrator is approaching either of the power supply rails. The ndrive 406 indicates that the output is approaching the lower power supply rail, whereas the npdrive 502 indicates that the output is approaching the upper power supply rail. So comparator 602 operates to compare each of the signals 406 and 502 to the reference voltage 608. If either of them is greater than the reference voltage 608, then the "satdet" signal 612 is positively asserted.

Within FIG. 7 are shown the specific transistors and signals by which an embodiment of FIG. 6 can be implemented. There may be other ways to implement the block diagram of FIG. 6, and the claims should determine the scope of the invention and not the particular circuits of FIG. 7. Within FIG. 7, there are indicated the particular block elements of FIG. 6. Specifically, the block indicated by "602" corresponds with the comparator 602 shown in FIG. 6. The specific signal inputs to the comparator circuit 602 are shown as the nodes 406, 502, and 608. The output 612, which is the saturation detect signal, is also shown on FIG. 7 as "satdet" 612. Further provided in the circuit of FIG. 7 is a reference voltage generator 702. From this reference voltage generator, the "maxref" reference signal 608 is generated and is provided as an input to the comparator 602.

Figure 8:
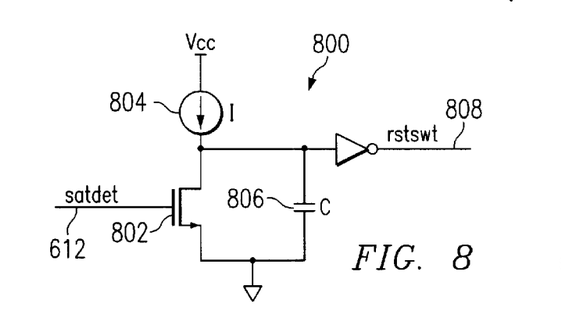
FIG. 8 is a schematic diagram of a circuit that can be used to generate a finite duration signal to condition the signal provided in FIGS. 6–7 as the saturation detection signal.

FIG. 8 provides a signal that condition the "satdet" signal 612 for later use in saturation detection and recovery schemes later described in this application. In FIG. 8, a saturation detection signal 612 is provided to transistor switch 802. A controlled current source is provided to the drain side of transistor 802, and the transistor 802 is connected in parallel to capacitor 806. Together, this circuitry provides a pulse of a known duration T, which is shown in the timing diagram of FIG. 8A as 822. A pulse of duration T is provided at the output 808 of the circuit of FIG. 8 and is called the reset switch signal ("rstswt"). According to the circuit shown here in FIG. 8, the duration T will be T=C*V/I.

Figure 8A:
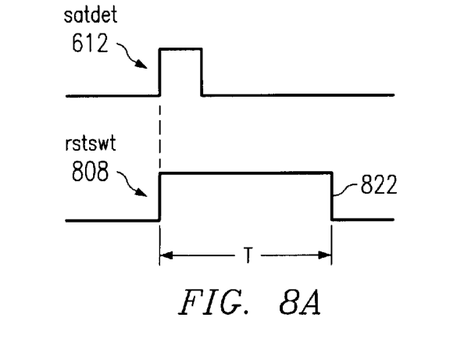
FIG. 8A is a timing diagram showing the duration of a reset pulse as it relates to a positive assertion of the saturation detection signal.

In FIG. 8A, the reset switch signal 808 is represented as the bottom wave form of the timing diagram of FIG. 8A. The "satdet" saturation detect signal 612 is the input to this reset generator circuit 800 of FIG. 8. The "satdet" signal 612 is shown as the upper trace of the timing diagram of FIG. 8A.

Still referring to FIG. 8A, the upper signal trace 612 for the saturation detect circuit shows the rising edge and the detection of a saturation condition in the output of the I5 integrator 118. The satdet signal stays high as long as the saturation condition exists.

Figure 9:
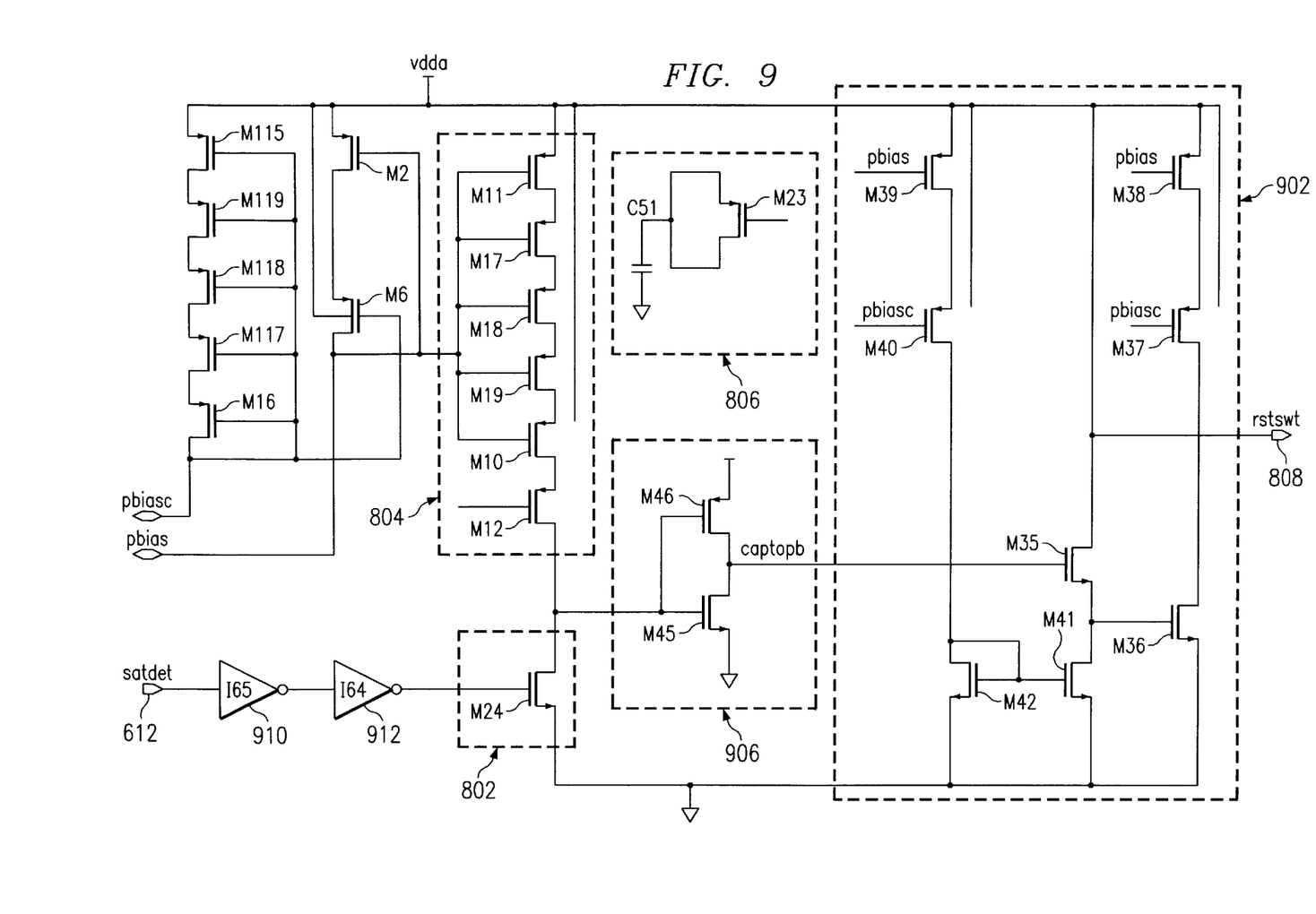
FIG. 9 is a more-detailed circuit diagram of an embodiment of the circuit shown in FIG. 8.

FIG. 9 provides a circuit 900 to implement the block diagram shown in FIG. 8 for the reset generator 800. In FIG. 9, the "satdet." input signal saturation detection 612 is provided as an input through two inverters 910, 912 into the switch transistor 802, which is also shown as one of the elements of FIG. 8. The controlled current source is shown as the block 804, which goes again into the drain of the switch transistor 802. The circuit 806 provides the capacitive function by using a small capacitor. The small capacitance of 904 is multiplied by the circuit of 906 using the Miller effect. The output of the circuit 906 passes through some conditioning circuit 902, which provides the desired timing pulse characteristics of the reset switch signal 808, as was previously shown as the pulse 822 of FIG. 8A. And the "rstswt" reset switch signal 808 is provided at the output of this circuit.

Figure 10:
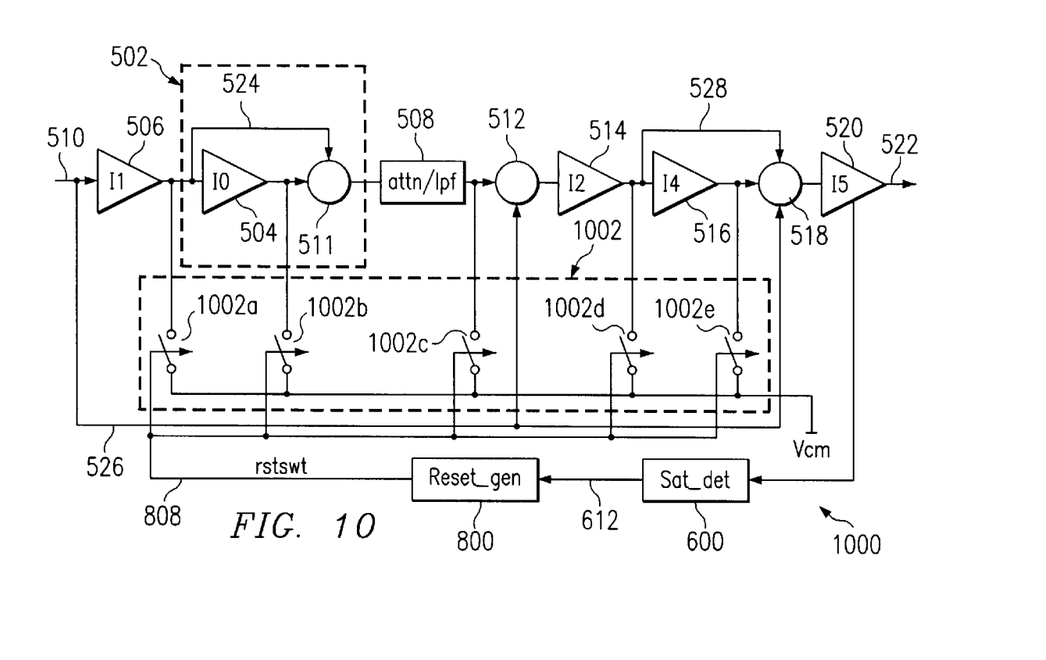
FIG. 10 is a diagram of an embodiment of a high order amplifier circuit incorporating the saturation detection and recovery circuit.

In FIG. 10 an embodiment is provided for dealing with the output saturation of the I5 integrator. Typically, in an amplification system such as this, a step input signal into input 510, which is shown as the input in the diagram of FIG. 11, can cause an "overshoot" in the system response at the output of the amplification system 522. This is shown as the signal 1104, at the beginning of the signal where the graph shoots up to the highest point. At this point, the output of the I5 integrator 520, is approaching the positive supply rail as it would be shown according to FIG. 11. Note that this condition could also occur in a negative-going step input, which would be the situation where the input signal 510 goes from a high voltage to a low voltage immediately, and the system response signal would overshoot to the negative side. As previously mentioned, when the output voltage of the I5 integrator 520 approaches one of the power supply voltages, it goes into saturation mode, which can cause instability because of the previously-mentioned shifting of the handover point.

The circuit shown in FIG. 10 addresses this problem by reducing the higher-order system shown in the circuit 1000 to a first-order system which is solely comprised of the integrator 520 as it is reached through the forward bypass path 526. Effectively, the circuits shown in FIG. 10 shorts out the lower frequency integrators, $I_1$, $I_0$, $I_2$, and $I_4$, leaving only the highest frequency integrator. This is accomplished by using the previously described saturation detection circuit 600, along with the reset generator circuit 800, which generates the reset switch signal 808. This reset switch signal 808 feeds into a set of switches 1002. This set of switches 1002, as can be seen in FIG. 10, uses a separate switch for each integrator to short the output of the integrator to Vcm, which is the common-mode voltage. With the outputs of all the integrators 506, 504, 514, 516 taken to the common mode voltage, which acts as a ground signal for the integrators. The inputs from the lower frequency integrators, which go into the summer 518 are effectively taken to the common mode voltage, with only the input 510 feeding through to the summer through the path 526. Thus, only the input signal 526 is path through to the input of the integrator 520 when the switch block 1002 removes the remaining integrators from the circuit.

The circuitry of FIG. 10 is a higher-order system, which is connected as follows. Operational amplifier input 510 is provided as an input to a first amplifier (I1) 506, the output of which is received in a second amplifier (I0) 504. A first summer 511 is provided, which adds the signals together from the output of the second amplifier 504 and from a bypass path 524. At the output of the summer 511 is received by an attenuator/low-pass filter 508, and the output of the attenuator/low-pass filter 508 is provided in turn to a second summer. At the output of the attenuator/low-pass filter 508 is a second summer, which receives the output of the attenuator/low-pass filter 508 and adds it to the original operational amplifier signal input, which is received at a second input to the second summer via bypass path 526. A third amplifier (I2) 514 receives the output signal from the second summer 512, and provides at its output an output signal which is received by a fourth amplifier (I4) 516. A third summer 518 is provided at the output of fourth amplifier 516, and the third summer adds to the output of the fourth amplifier, a signal from the input to the fourth amplifier via a bypass path 528 along with the input signal to the operation amplifier 510 via the bypass path 526. A fifth amplifier 520 is provided at the output of the third summer 518. This fifth amplifier 520 is the output amplifier, and it is this output amplifier that the Sat_det circuit 600 monitors for saturation. When saturation is detected, the Sat_det circuit 600 activates the Reset_gen circuit to send a "rstswt" signal which shorts the outputs of the first, second, third, and fourth amplifiers 506,504,512,514,516 to the common-mode signal "Vcm" by controlling the switches 1002. Effectively, then, the operational amplifier input signal 510 is only provided through the summer 518 to the fifth amplifier (I5) 520 until the saturation condition is removed.

Figure 10A:
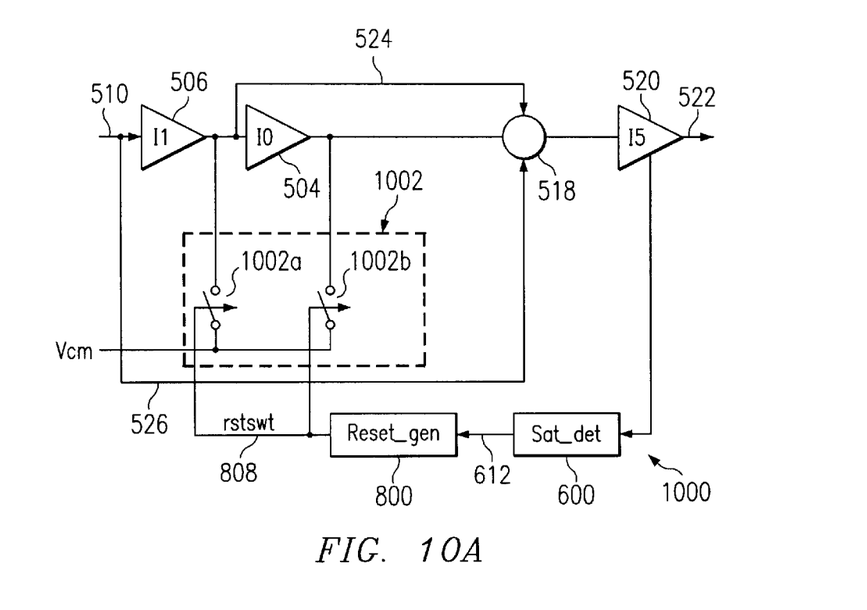
FIG. 10A is a diagram of another embodiment of an amplifier circuit employing the saturation detection and recovery circuit.

It is possible, however, to employ a saturation detection reset generation signal for lower-order or higher-order operational amplifier circuits. FIG. 10A, for example, shows a way to apply the saturation detection circuitry and the reset generation circuitry to a lower-order operational amplifier circuit having three amplifiers or integrators. This lower-order operational amplifier circuit is connected as follows. A first amplifier (I1) 506 is connected to the operational amplifier signal input and receives that signal input. The output of the first amplifier (I1) 506 is connected to the input of a second amplifier (I0) 504. A summer 518 having a first, second, and third input is connected at its first input to the output of the second amplifier 504. The summer also receives at its second input a signal from a bypass path 524 which originates from the signal path between the first and second amplifiers, and receives at its third input a signal from another bypass path 526 which originates at the operational amplifier signal input. A third amplifier (I5) 520 is provided at the output of the summer 518. This third amplifier 520 is the output amplifier, and it is this output amplifier that the Sat_det circuit 600 monitors for saturation. When saturation is detected, the Sat_det circuit 600 activates the Reset_gen circuit to send a "rstswt" signal which shorts the outputs of the first and second amplifiers to the common-mode signal "Vcm" by controlling the switches 1002. Effectively, then, only the operational amplifier input signal 510 is provided through the summer 518 to the third amplifier (I5) 520 until the saturation condition is removed.

Many different circuit configurations could be employed using the circuitry for detecting saturation conditions in operational amplifiers and bypassing early-stage amplifier circuitry. For example, additional amplifiers and/or filters could be added between the second amplifier 504 and the summer 518 of the embodiment of FIG. 10A. By adding various stages of amplification to FIG. 10A, essentially the same order of stages of amplification could be reached as in the embodiment of FIG. 10. An intermediate number of stages could be employed by only adding some of the additional filter stages which are shown in FIG. 10. Although the embodiments described above use switches to bypass all but the final stage of amplification during saturation, the circuitry could be designed with a multiple-stage output of amplification that might still be maintained during saturation. To use this multiple-stage output approach, for example, the design techniques for stability described with respect to FIGS. 2–3 would be employed, but would typically be employed to assure stability of the multiple stages of output filtering during saturation. Inventions encompassed within this application should not be limited to the particular embodiments described herein, but instead should be determined based on the open language of the claims set forth below.

Figures 11, 12, 13:
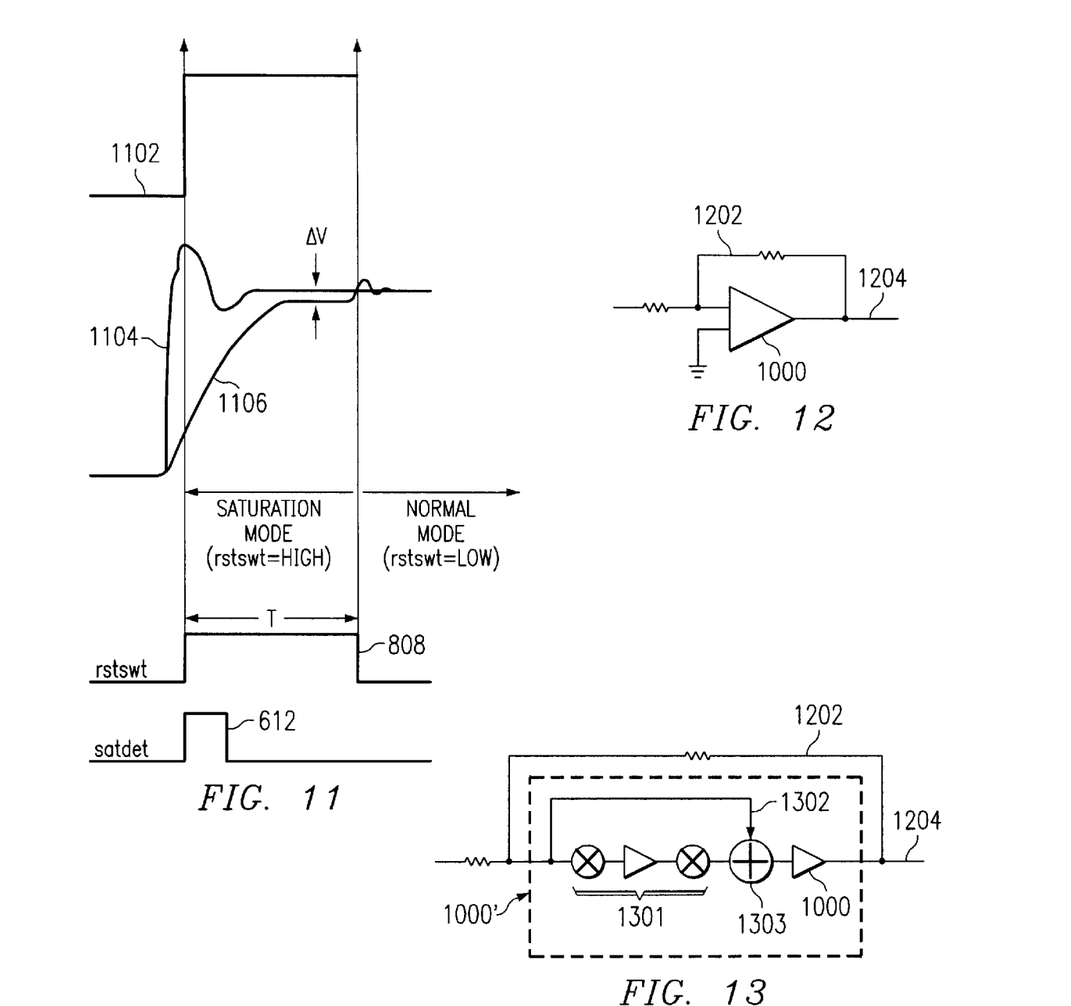
FIG. 11 is a timing diagram showing the step response of a preferred embodiment system alternatively when corrected for saturation mode and when in normal, uncorrected mode.
FIG. 12 is a schematic representation of the circuitry of FIG. 10 in saturation mode, when the circuit has been reset to bypass the low frequency paths.
FIG. 13 is a diagram illustrating the substitution of a chopper amplifier for an amplifier input stage.

FIG. 12 is a representation of the circuitry of FIG. 10 in saturation mode, when the circuit has been reset to bypass the low frequency paths entirely. As you can see, this schematic shown in FIG. 12 reduces to a single amplifier, which is I5 in the circuitry of FIG. 10. FIG. 12 shows the amplifier in a closed-loop configuration as created by the resistor feedback path 1202. The difficulty with operating a circuit in this configuration is when the closed-loop gain is of a high level, as previously mentioned. The offset voltage of amplifier I5, will be amplified by the closed-loop gain; in the case of a high gain configuration, an undesirable amplified offset signal appears at the output 1204. Often these types of input offsets are addressed using a chopper configuration, but because of the unique nature of the I5 amplifier as an output amplifier, the implementation of a chopper amplifier in this configuration is difficult.

In general terms the difficulties posed by the amplification offset of the amplifier I5 can be addressed by placing a chopper amplifier in the replacement saturation circuit in front of the I5 integrator as shown in FIG. 13. This problem can be addressed in an alternative embodiment by collapsing the circuit such as shown in FIG. 10 to a second order system rather than a first order system. This allows for retention of a front-end end integrator whose offset can then be chopped to a very low value, such as a few microvolts. Now, instead of the offset voltage of the integrator I5 being amplified by the closed-loop gain of the system, a much smaller offset voltage of the chopper amplifier is amplified by the closed-loop gain of the system, thereby mitigating the effects of the offset voltage being amplified by the closed-loop gain of the system, particularly in a high gain implementation. Thus through this alternative embodiment the small offset voltages will not be enough to cause amplifier I5 to saturate even in very high closed-loop gain configurations.

The previously-mentioned offset issues relating to the amplifier I5 offset being amplified by the closed-loop gain of this collapsed system is that once the saturation condition is entered into, if the offset voltage being amplified is of such a large magnitude as to saturate the I5 amplifier in this configuration also, the system will never return from its saturated condition and will continue infinitely. For example in a single order system as shown in FIG. 12, if the I5 integrator has a 5 mV offset, and the closed-loop gain of the FIG. 12 configuration is one-thousand, this will show up as five volts at the output of the circuit 1204. On a five volt power supply, this offset itself will saturate the output causing the saturation detect signal ("satdet") to stay active, which in turn will cause the system to stay in the saturation mode. This problem would not exist when the collapsed configuration of FIG. 10 does not have a high closed-loop gain. Therefore, this alternative embodiment can be used in a high gain configuration, whereas the embodiment of FIG. 10 can still be used in configurations where the closed-loop gain of the collapsed system is not so high.

In FIG. 13, the difficulty associated with the high gain configuration amplification of the input offset voltage is addressed by interposing a second order, chopper amplifier 1301 at the input to the amplifier 1000. The chopper amplifier 1301 is bypassed with the bypass path 1302, and those two paths are added together at the summer 1303. Together, the chopper amplifier 1301, bypass path 1302, summer 1303 and amplifier 1000 combine to form a new amplifier 1000' which does not suffer from the same amplified input offset problem.

Figure 14:
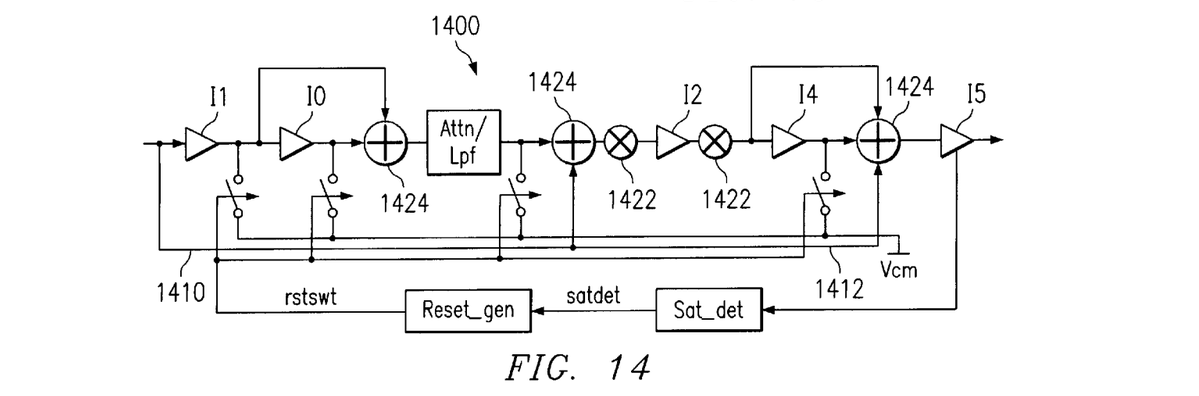
FIG. 14 is a diagram of a high order amplifier circuit in which a chopper amplifier has been placed at the input to the circuit.

FIG. 14 provides an embodiment where the second order approach illustrated in FIG. 13 is implemented in a circuit similar to the circuit of FIG. 10. I5 will always be the output integrator for this configuration, but any one of the earlier integrators in the chain from the circuit of FIG. 10, i.e., I0, I1, I2, and I4, can be used as a front end integrator, and different configurations could be realized to deal with the problems described in the prior paragraphs. In this example, I2 is used as a front-end integrator by the configuration of the switches and the summers. As can be seen in FIG. 14, I2 is here configured as an integrator with input and output choppers 1422 to reduce greatly the offset gain of the front-end integrator. Thus, when the circuit is put into saturation mode by some type of signal transient, the only integrators remaining effectively in the circuit are the I2 and the I5 through the bypass path to the second summer and to the third summer in the circuit. As mentioned, this approach will mitigate the effects of the I5 offset voltage allowing the circuit to be operated in high gain, closed-loop configuration without concern for the I5 offset voltage. The remaining circuit elements of FIG. 14 have analogous components in FIG. 10, and these analogous components operate as described in the previous figure.

Figure 15:
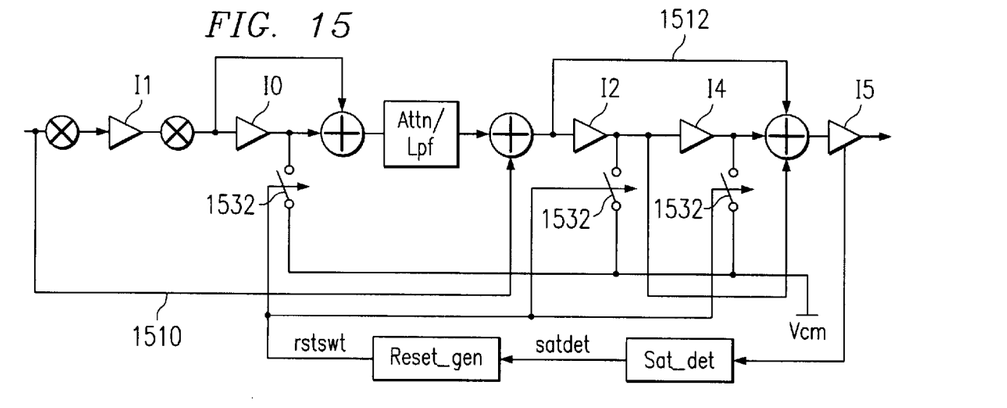
FIG. 15 is a diagram of another embodiment of a high order amplifier circuit using the saturation detection and recovery circuitry in which a chopper amplifier has been used to reduce effects of input offset voltage.

FIG. 15 shows another alternate embodiment where the first stage amplifier I1 is used as the front-end integrator in the saturation mode. The reset switches in the bypass paths are rearranged as previously discussed to provide a path from the output of I1 to the input of I5. Also provided are feed forward paths 1510 and 1512. When the switches are closed due to a saturation condition, as with the circuitry of FIG. 14, the circuitry of FIG. 15 also forms a simplified two-stage amplifier which is basically the simplified amplifier shown in FIG. 13.

Figure 16:
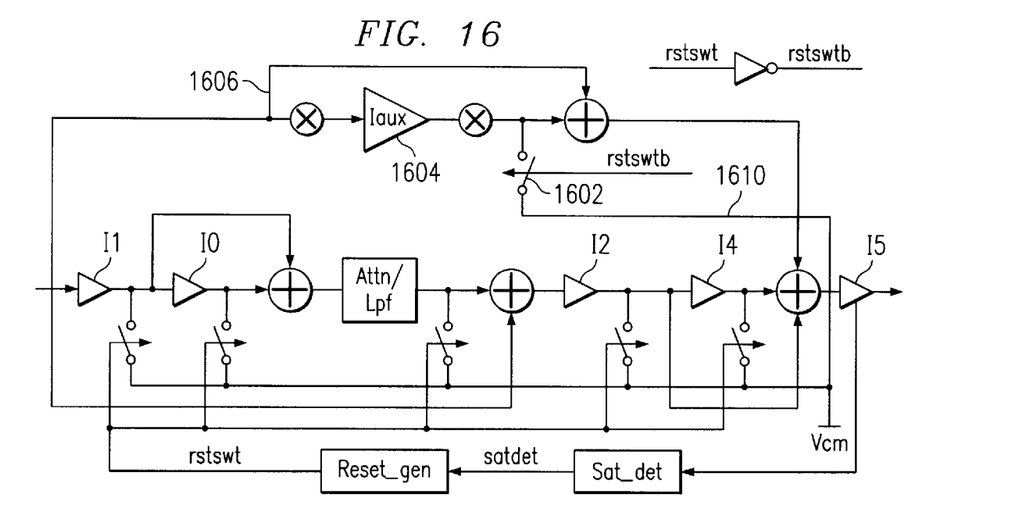
FIG. 16 is a diagram of another embodiment of a high order amplifier circuit suing a completely switched alternative path which is employed only to carry the bypassed signals when the amplifier is in saturation mode.

Another variation of the above-mentioned solution is shown in FIG. 16. In this figure, an auxiliary integrator (Iaux) is provided as a bypass circuit which is actually placed into the circuit when by the inverse of the reset switch which removes the other circuits from the system. The advantage of providing an auxiliary integrator rather than using one of the other integrators as the front end integrator in this circuit is that this auxiliary integrator can be designed for the small and limited purpose of performing as the front end integrator in saturation mode. This approach may somewhat simplify the design by decreasing the amount of reconfiguration that must be done in the integrators that are provided in the normal, non-saturated configuration. As mentioned, the auxiliary amplifier is connected into the circuit through the operation of the switch 1602 which is controlled by the inverted reset switch signal ("rstswtb"). Thus, when the circuit is in saturation mode, the signal paths remaining will exclusively be through the auxiliary integrator 1604 and its bypass 1606, and then through integrator I5. As in the previous designs, the auxiliary integrators provided is a chopping amplifier to reduce the input offset voltage. In the normal mode, since the inverse of the reset switch signal is used, this auxiliary integrator is shorted to the common mode voltage through path 1610, thus effectively removing this path from the circuit.

Referring again to FIG. 16, and referring to another advantage of this configuration, the bandwidth of $I_{aux}$ is designed such that, together with I5, it forms an unconditionally stable system. This avoids the need to modify the bandwidth of any of the other integrators which would otherwise act as the front end integrator for the saturation system to insure the unconditional stability of the circuit in saturation mode. In the new embodiments described in this application, the small signal parameters such as the bandwidth of the front end integrator and pole location of I5 are adjusted considering the additional circuits such that the system remains unconditionally stable at all times.

Figure 17:
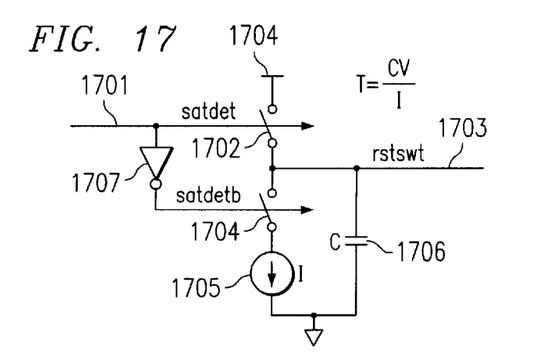
FIG. 17 is a schematic diagram of a circuit that can be used to generate internal signals for use in the saturation detection circuit.
Figure 17A:
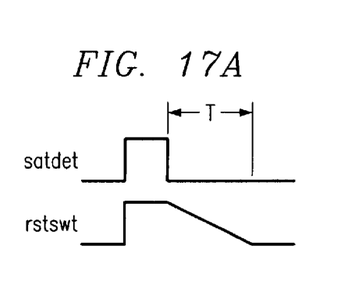
FIG. 17A is a timing diagram showing the duration of a reset pulse as it relates to a positive assertion of the saturation detection signal.

FIG. 17 provides an alternative reset generation circuit which provides a pulse having a trailing-off or linear ramp-down shape. This signal applied to the bypass switches of the prior embodiments gradually opens these switches and helps avoid overshoot and settling behavior which often results from step-function signal inputs, and which accordingly helps avoid saturation. This configuration receives a normal satdet signal with step-function signal transitions and converts it to a modified rstswt signal of FIG. 17A. For example, a positively asserted "satdet" signal closes the switch 1702 to immediately connect the rstswt output 1703 to the positive supply rail 1704. Thus, the positive-going signal edge of the output 1703 is sharp. When this is happening, the switch 1704 is kept open by the inverted satdet signal, "satdetb." The inverter 1707 inverts the satdet signal. The open 1704 keeps the current source 1705 from trying to draw current from the capacitor 1706, and allows the capacitor 1706 to fully charge.

When the "satdet" signal is negatively asserted, the switch 1702 is opened, cutting off the positive supply to the rstwst output 1703. At the same time, the inverted satdet signal, satdetb, closes switch 1704, and immediately the controlled current source 1705 begins pulling charge out of the capacitor 1706. This removal of charge from the capacitor will reduce the voltage across the capacitor such that the rstswt signal 1703 will ramp down. The gradual ramp down of the signal avoids a step-function response in the system, which, especially when the steady state magnitude of the input signal keeps the amplifier close to saturation, could cause re-saturation. Without configuring the reset circuitry to avoid step-function response saturation, the circuit could be subject, under certain types of input signal conditions, to a low amplitude oscillation of frequency 1/T, where T is the time constant of the reset_gen circuit 1700, in this case CV/I (capacitance*voltage/current). This reset_gen circuit can be implemented in any of the above saturation detection and recovery circuits.

A few preferred embodiments have been described in detail hereinabove. It is to be understood that the scope of the invention also comprehends embodiments different from those described, yet within the scope of the claims. Words of inclusion are to be interpreted as nonexhaustive in considering the scope of the invention.

Implementation is contemplated in discrete components or fully integrated circuits in silicon, gallium arsenide, or other electronic materials families, as well as in optical-based or other technology-based forms and embodiments. It should be understood that various embodiments of the invention can employ or be embodied in hardware, software or microcoded firmware. Summers can be implemented using operational amplifiers, wired connections, passive devices, electro-optic devices, integrated optic devices, acousto-optic devices or other implementations. Amplifiers can be discrete transistor amplifiers, operational amplifiers, optical amplifiers, traveling-wave-tube amplifiers, RF amplifiers, or other implementations. References in the claim preamble to "operational amplifiers" and to elements in the claims to "operational amplifier signal inputs or outputs should thus be construed broadly to cover other types of amplifiers, as the term "operational amplifier" has been used herein to distinguish from single-element amplifiers and thus to refer to any amplifier which may have subsidiary amplifying elements.

Bypass paths include hard-wired connections, RF connections, acoustic connections, or optical connections, and may include other elements interposed in the bypass paths. A given amplifier stage can include one or more than one sub-stages and/or one or more amplifying elements. A connection between amplifier stages or between other elements can include additional amplifiers or filtering elements, and therefore connections between elements recited in this application shall be inclusive of connections having additional elements interposed between such elements.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An operational amplifier comprising:
   a) an operational amplifier signal input;
   b) an operational amplifier signal output;
   c) a operational amplifier reference voltage input;
   d) a first amplifier, said first amplifier having an input connected to said operational amplifier signal input and having an output;
   e) a second amplifier having an input connected to said output of said first amplifier and having an output;
   f) a summer, said summer having a first input connected to said output of said second amplifier, a second input, a third input, and an output;
   g) a first bypass signal path around said second amplifier, said first bypass signal path connected at one end to the signal path between said first and second amplifiers and at the other end to said second input of said summer;
   h) a third amplifier having an input connected to said output of said summer and having an output connected to said operational amplifier signal output;
   i) a second bypass signal path around said first and second amplifiers, said bypass signal path connected at one end to the signal path between said operational amplifier signal input and said input of said first amplifier, and at the other end to said third input of said summer;
   j) a saturation detector connected to said third amplifier, said saturation detector operable to detect when said third amplifier is in saturation and to assert an output signal indicating that saturation;
   k) a cut-off switch connected to the signal paths into said first and second inputs to said summer and to a reference voltage provided to said operational amplifier at said reference voltage input, said cut-off switch operable to connect said signal paths into said first and second inputs to said summer to the reference voltage upon receiving a positively-asserted saturation detection signal from said saturation detector.

2. The operational amplifier circuit of claim 1 wherein at least one of the first, second, and third amplifiers is an integrator.

3. The operational amplifier circuit of claim 1 and further comprising:

a) another summer having first and second inputs and an output;

b) a low-pass filter at the output of said another summer; wherein c) the series connection of the summer and low-pass filter is interposed between said output of said second amplifier and said input to said summer, and said second bypass path is additionally connected to said second input of said another summer, and said cut-off switch is further operable to connect the output of said low-pass filter to said reference voltage upon receipt of said positively-asserted saturation detection signal.

4. The operational amplifier circuit of claim 3 and further comprising a fourth amplifier having an input and an output, the fourth amplifier interposed between the output of said summer and said third amplifier, and wherein said cut-off switch is further operable to connect said output of said fourth amplifier to said reference voltage upon receipt of said positively-asserted saturation detection signal.

5. The operational amplifier of claim 1 wherein said operational amplifier reference voltage input receives a ground voltage signal.

6. The operational amplifier of claim 1 and further comprising a reset generator circuit interposed between said saturation detector and said cut-off switch, said reset generator operable to provide a reset signal of a finite duration upon receiving a positively-asserted saturation detection signal from said saturation detector.

7. The operational amplifier of claim 1 wherein said first amplifier is a chopper amplifier.

8. The operational amplifier of claim 1 wherein said second bypass signal path further comprises a bypass amplifier in the path between said input to said first amplifier and said third input to said summer and further comprising a second cut-off switch connected at one end to the output of said bypass amplifier and the other end to said reference voltage provided to said operational amplifier at said reference voltage input, said second cut-off switch operable to connect said signal paths at the output of said bypass amplifier to the reference voltage upon receiving a positively asserted, inverted version of the saturation detection signal from said saturation detector.

9. The operational amplifier of claim 8 wherein said bypass amplifier is a chopper amplifier.

10. The operational amplifier of claim 8 wherein said second bypass path further includes a bypass summer interposed in the path between the output of said bypass amplifier and said third input to said summer, said bypass summer having a first input which is connected to the output of said bypass amplifier and a second input, and wherein the second cut-off switch is connected to the bypass signal path at the input to said bypass summer.

11. The operational amplifier of claim 10 and further comprising a double bypass path around said bypass amplifier, said double bypass path connected at one end at the input to said bypass amplifier and at the other end to said second input of said bypass summer.

12. An operational amplifier comprising:

a) an operational amplifier signal input;

b) an operational amplifier signal output;

c) an operational amplifier reference voltage input;

d) a first amplifier, said first amplifier having an input connected to said operational amplifier signal input and having an output;

e) a second amplifier having an input connected to said output of said first amplifier and having an output;

f) a first summer, said first summer having a first input connected to said output of said second amplifier, a second input, and an output;

g) a second summer, said second summer having a first input connected to said output of said first summer, a second input, and an output;

h) a third amplifier having an input connected to said output of said second summer and having an output;

i) a fourth amplifier having an input connected to the output of said third amplifier and having an output;

j) a third summer, said third summer having a first input connected to the output of said fourth amplifier and having a second input, a third input, and an output;

k) a fifth amplifier having an input connected to said output of said third summer and an output connected to said output amplifier signal output;

l) a first bypass signal path around said second amplifier, said first bypass signal path connected at one end to the signal path between said first and second amplifiers and at the other end to said second input of said first summer;

m) a second bypass signal path around said fourth amplifier, said second bypass signal path connected at one end to the signal path between said third and fourth amplifiers and at the other end to said second input of said third summer;

n) a third bypass signal path around said first and second amplifiers, said third bypass signal path connected at one end to the signal path between said operational amplifier signal input and said input to said first amplifier and at the other end to said second input of said second summer;

o) a fourth bypass signal path around said first, second, third, and fourth amplifiers, said fourth bypass signal path connected at one end to the signal path between the operational amplifier signal input and said input of said first amplifier and connected at the other end to said third input of said third summer;

p) a saturation detector connected to said fifth amplifier, said saturation detector operable to detect when said fifth amplifier is in saturation and to assert an output signal indicating such saturation;

q) a cut-off switch connected to the signal paths into said second amplifier, said first summer, said second summer, said fourth amplifier, and said third summer, and to a reference voltage provided to said operational amplifier at said operational amplifier reference voltage input, said cut-off switch operable to connect said signal paths to the reference voltage upon receiving a positively-asserted saturation detection signal from said saturation detector.

13. The operational amplifier of claim 12 wherein said first and second summers are a single summer having three inputs.

14. The operational amplifier of claim 12 and further comprising an attenuator having an input and an output, said attenuator being interposed between said first and second summers such that said input to said attenuator is connected to the output of said first summer and said output from said attenuator is connected to the input of said second summer, and wherein said cut-off switch is connected to the signal path between said attenuator and said input to said second summer.

15. The operational amplifier of claim 12 wherein said cut-off switch is a set of switches connecting said signal paths to said reference voltage.

16. The operational amplifier of claim 12 and further comprising a reset generator circuit interposed between said saturation detector and said cut-off switch, said reset generator operable to provide a reset signal of a finite duration upon receiving a positively-asserted saturation detection signal from said saturation detector.

17. A method for operating a conditionally-stable multi-path operational amplifier, said method comprising:
   a) providing a first signal path through at least a first and a second amplifiers;
   b) providing a second signal path around said first and second amplifier;
   c) providing a summer to add the signals from said first and second signal paths;
   d) providing a third amplifier to amplify the added signals from the summer,
   e) establishing the gains of the amplifiers and the relative weightings of the signals through the summer such that the system response of the system is unconditionally stable when only the signal through said second signal path is enabled, and such that the system response of the entire system comprising said first and second signal paths, first and second amplifier, said summer, and said third amplifier is conditionally stable, wherein said system is stable for input signal frequencies of less than the system open-loop unity gain frequency and unstable for input signal frequencies of greater than the system open-loop unity gain frequency;
   f) providing a saturation detector to detect when said operational amplifier is saturated;
   g) disabling said first signal path when said operational amplifier is saturated; and
   h) re-enabling said first signal path when said saturation condition is removed.

18. The method of claim 17 wherein said disabling of said first signal path occurs for a finite duration after which said saturation detector again detects whether said operational amplifier is still saturated, whereupon if said operational amplifier is still saturated, said first signal path is again disabled according to a signal from the saturation detector.

19. The method of claim 17 wherein said disabling of said first signal path is done by connecting said signal path through a switch to a reference voltage.

20. An operational amplifier comprising:
   a) an operational amplifier signal input;
   b) an operational amplifier signal output;
   c) a operational amplifier reference voltage input;
   d) a first amplifier, said first amplifier having an input connected to said operational amplifier signal input and having an output;
   e) a first summer, said first summer having a first input connected to said output of said first amplifier, a second input, and an output;
   f) a first bypass signal path around said first amplifier, said first bypass signal path connected at one end to the input to said first amplifier and at the other end to said second input of said first summer;
   g) an attenuator having an input connected to the output of said first summer and having an output;
   h) a second summer, said second summer having a first input, a second input, and an output, said first input of said second summer being connected to the output of the attenuator;
   i) a second bypass signal path around said first amplifier, said first summer, and said attenuator, said second bypass signal path being connected at one end to the input to said first amplifier and at the other end to said second input of said second summer;
   j) a chopper amplifier having an input connected to the output of said second summer, and having an output;
   k) a third summer having a first input connected to the output of the chopper amplifier and having a second input and an output;
   l) a third bypass signal path around said first amplifier, said chopper amplifier, said attenuator, and said first and second summers, said third bypass signal being connected at one end to said input to said first amplifier and at the other end to said second input of said third summer;
   m) a third amplifier having an input connected to said output of said summer and having an output connected to said operational amplifier signal output;
   n) a saturation detector connected to said third amplifier, said saturation detector operable to detect when said third amplifier is in saturation and to assert an output signal indicating that saturation; and
   o) a cut-off switch connected to the signal paths into at least said third summer, said cut-off switch operable to connect said signal path to the reference voltage upon receiving a positively-asserted saturation detection signal from said saturation detector.

21. The operational amplifier of claim 20 and further comprising a reset generator circuit interposed between said saturation detector and said cut-off switch, said reset generator operable to provide a reset signal of a finite duration upon receiving a positively-asserted saturation detection signal from said saturation detector.

22. The operational amplifier of claim 21 wherein said cut-off switch is comprised of multiple switches which are operable to connect at least two of the signal paths into said first, second, and third amplifiers, said chopper amplifier, and said first, second, and third summers upon receiving a positively-asserted saturation detection signal from said saturation detector.

23. The operational amplifier of claim 21 and further comprising a fourth amplifier interposed between said first amplifier and said amplifier input whereby the output of said fourth amplifier is received at the input to said first amplifier.

24. The operational amplifier of claim 23 wherein said cut-off switch is further operable to connect the input to said first amplifier to said reference voltage.

25. An operational amplifier comprising:
   a) an operational amplifier signal input;
   b) an operational amplifier signal output;
   c) a operational amplifier reference voltage input;
   d) a chopper amplifier, said chopper amplifier having an input connected to said operational amplifier signal input and having an output;
   e) a first amplifier having an input connected to said output of said chopper amplifier and having an output;
   f) a first summer, said first summer having a first input connected to said output of said first amplifier, a second input, and an output;
   g) a first bypass signal path around said first amplifier, said first bypass signal path connected at one end to the signal path between said chopper and said first amplifier and at the other end to said second input of said summer;

h) a second amplifier having an input connected to said output of said summer and a having an output connected to said operational amplifier signal output;

i) a saturation detector connected to said second amplifier, said saturation detector operable to detect when said second amplifier is in saturation and to assert an output signal indicating that saturation; and j) a cut-off switch connected to the signal paths into at least one of said first amplifier and said first summer, and to a reference voltage provided to said operational amplifier at said reference voltage input, said cut-off switch operable to connect said signal paths into said first amplifier and said first summer to the reference voltage upon receiving a positively-asserted saturation detection signal from said saturation detector.

26. The operational amplifier of claim 25 and further comprising an attenuator in the signal path between said first amplifier and said second amplifier.

27. The operational amplifier of claim 26 wherein said attenuator is a low-pass filter.

* * * * *